United States Patent [19]

Lüscher et al.

[11] 3,983,411

[45] Sept. 28, 1976

[54] FREQUENCY DIVIDER

[75] Inventors: Jakob Lüscher, Carouge-Geneva; Andreas Rusznyak, Chene-Bougeries, both of Switzerland

[73] Assignee: Ebauches S.A., Neuchatel, Switzerland

[22] Filed: May 27, 1975

[21] Appl. No.: 580,569

[30] Foreign Application Priority Data

May 29, 1974 Switzerland.......................... 7308/74

[52] U.S. Cl. ........................ 307/225 C; 307/224 C; 58/23 A
[51] Int. Cl.² ........................................ H03K 23/30
[58] Field of Search ........ 307/220 C, 224 C, 225 C; 58/23 A, 50 R

[56] References Cited
UNITED STATES PATENTS

| 3,383,570 | 5/1968 | Lüscher .................... 307/220 C X |
| 3,645,088 | 2/1972 | Luscher .................... 307/225 C X |
| 3,760,580 | 9/1973 | Fujita ...................... 307/225 C X |

FOREIGN PATENTS OR APPLICATIONS

| 1,235,245 | 6/1971 | United Kingdom ............. 307/225 C |

*Primary Examiner*—John S. Heyman
*Assistant Examiner*—Larry N. Anagnos
*Attorney, Agent, or Firm*—Karl F. Ross; Herbert Dubno

[57] ABSTRACT

A binary frequency-divider stage for an electronic wristwatch comprises a set of insulated-gate field-effect transistors (IGFETs) of one and the same conductivity type, one ($T_1$) of these IGFETs and an associated series capacitor ($C_1$) forming an amplifier located between one bus bar (M) of a d-c supply and a first one (11) of two a-c control leads carrying a pair of bipolar pulse trains ($\Phi_1$, $\Phi_2$) of opposite phase. An incoming pulse sequence ($V_{E1}$), of a cadence to be halved, is in phase with the pulse train ($\Phi_2$) on the other control lead (12) and may be derived directly therefrom (FIG. 5). The gate capacitance of the first IGFET ($T_1$) can be charged in two steps by a first charging circuit including two IGFETs ($T_2$, $T_3$) which are alternately turned on by respective control pulses ($\Phi_1$, $\Phi_2$) applied to their gates. A normally blocked discharging circuit, including two other IGFETs ($T_4$, $T_5$), serves to discharge that gate capacitance, the gate capacitance of one of the IGFETs ($T_5$) of this discharging circuit being chargeable through a second charging circuit including two further IGFETs ($T_6$, $T_7$). The fifth IGFET ($T_5$) is rendered conductive upon the successive occurrence of an incoming pulse ($V_{E1}$) and a first control pulse ($\Phi_1$) respectively turning on the sixth and seventh IGFETs ($T_6$, $T_7$). Upon the conduction of the fourth IGFET ($T_4$), in response to the next incoming pulse, the first IGFET ($T_1$) is cut off whereby the next-following first control pulse ($\Phi_1$) gives rise to an outgoing pulse ($V_{E2}$) on the junction (d) between that transistor and its series capacitor ($C_1$). The gate of the fifth IGFET ($T_5$) is discharged through an eighth IGFET ($T_8$) controlled by the outgoing pulse. The third IGFET ($T_3$) may be included in the normally blocked discharging circuit for the gate of the first IGFET ($T_1$); alternatively, to prevent a premature discharge of that gate, the common terminal of the fourth and fifth IGFETs ($T_4$, $T_5$) may be recharged, after each incoming pulse ($VE_1$) discharging this common terminal, by a ninth IGFET ($T_9$) responsive to the first control pulse ($\Phi_1$).

4 Claims, 25 Drawing Figures

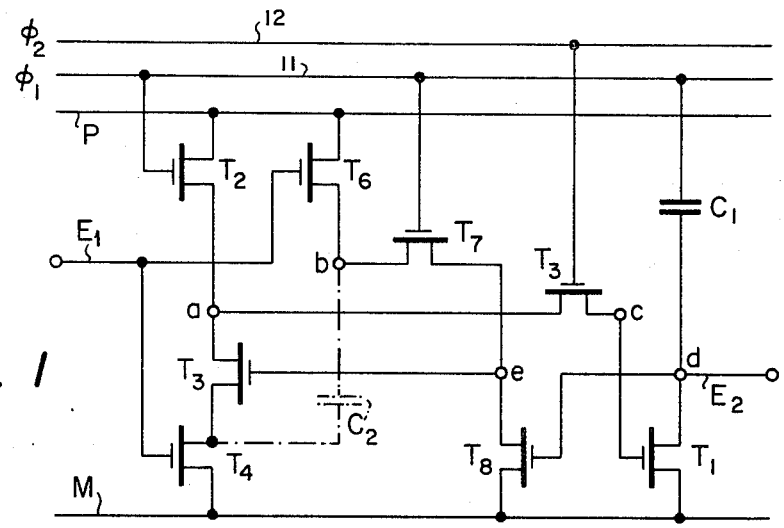
*Fig. 1*
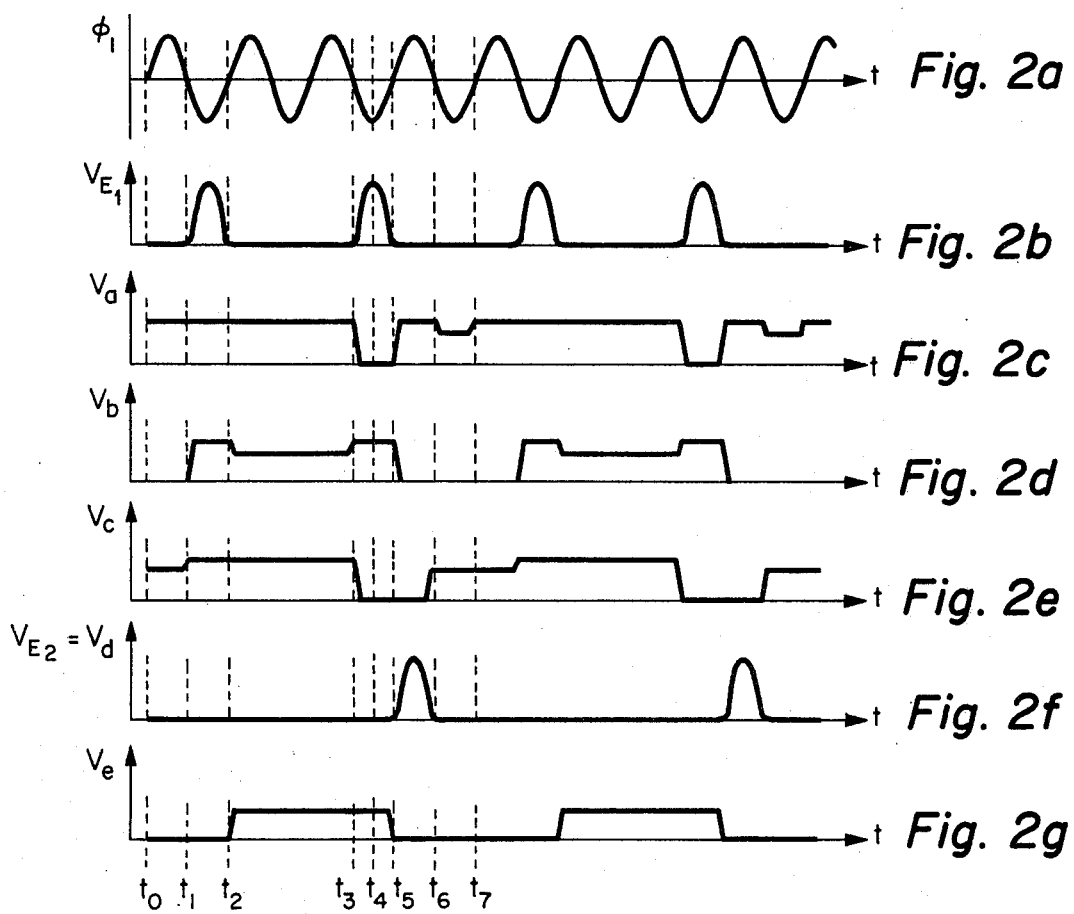

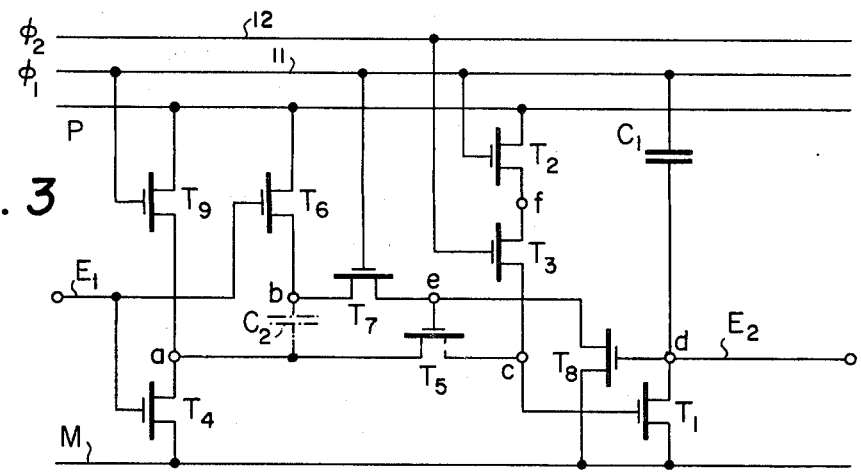
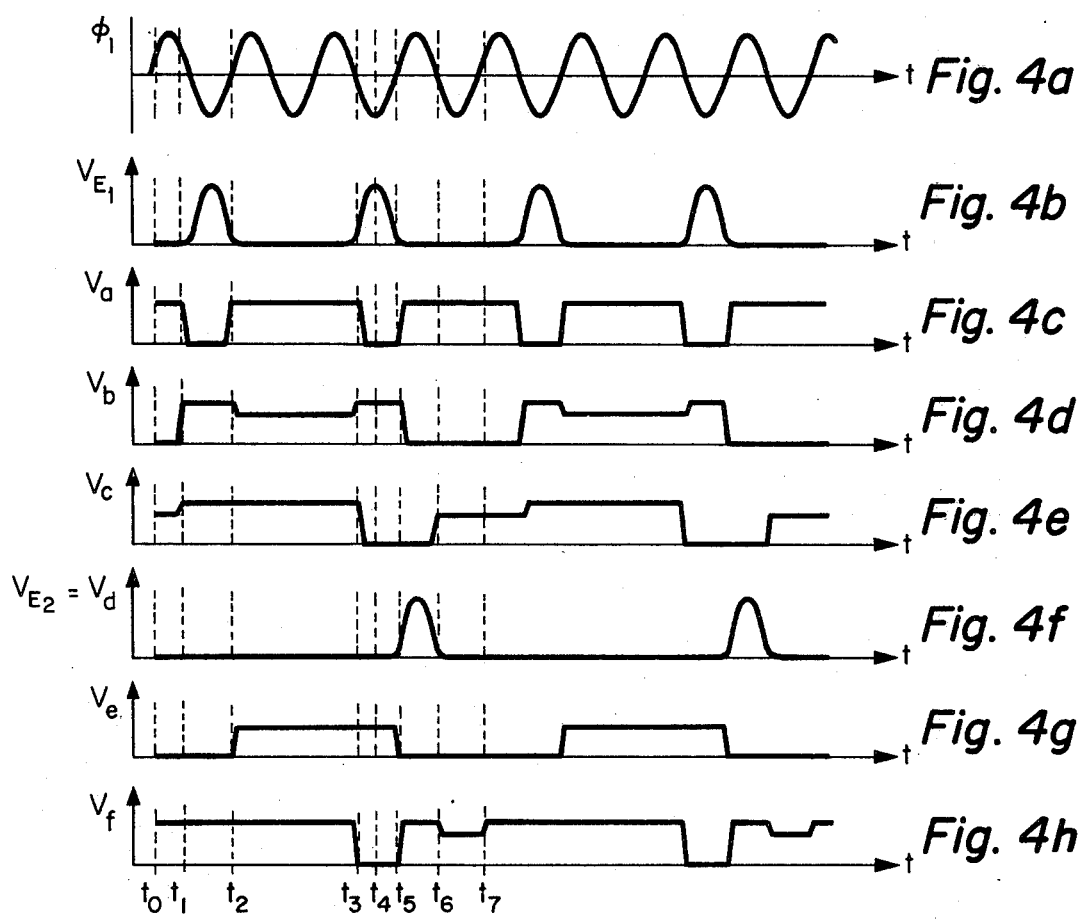

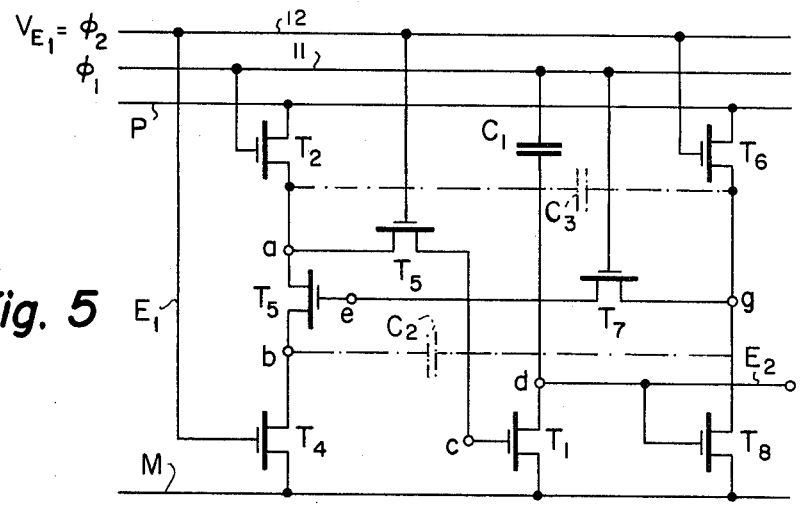
Fig. 5
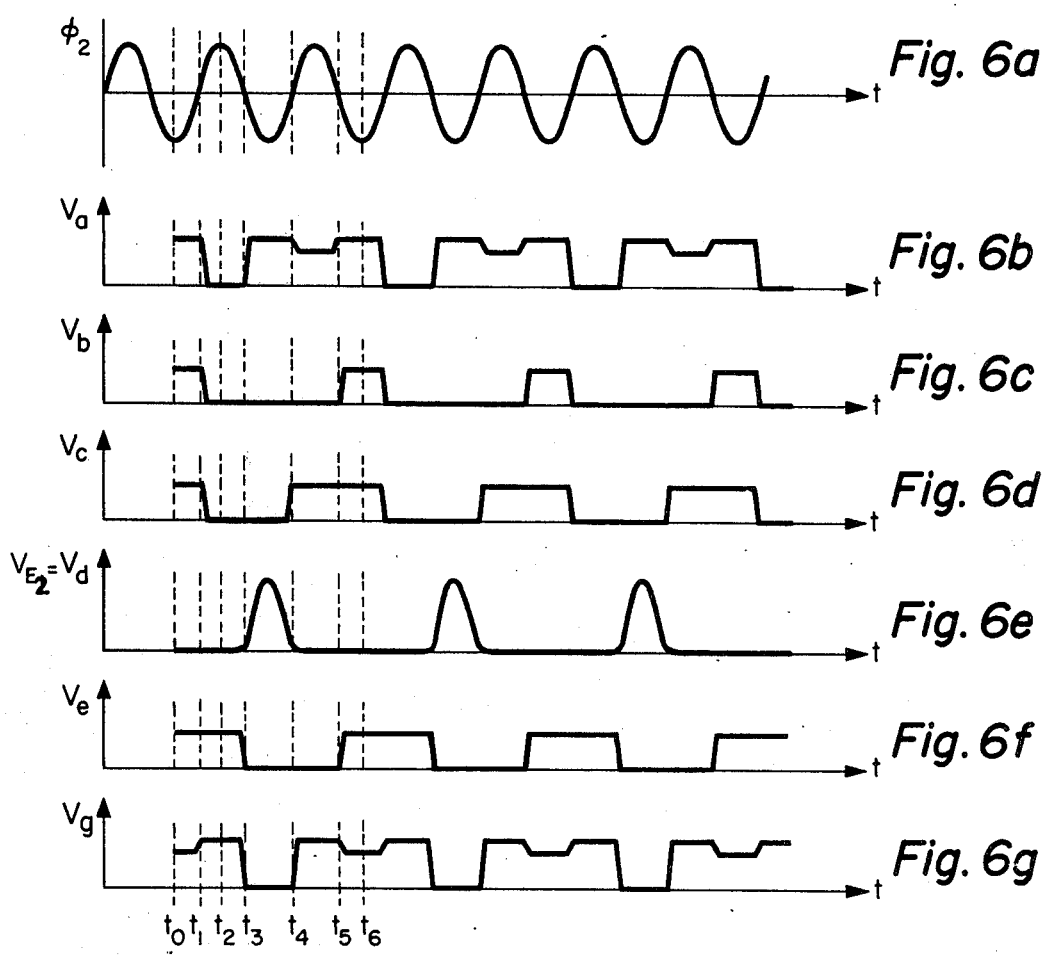
Fig. 6a
Fig. 6b
Fig. 6c
Fig. 6d
Fig. 6e
Fig. 6f
Fig. 6g 3,983,411

FREQUENCY DIVIDER

FIELD OF THE INVENTION

Our present invention relates to a frequency divider and, in particular, to a binary frequency-divider stage adapted to be used to step down the cadence or repetition frequency of a pulse sequence.

BACKGROUND OF THE INVENTION

At the International Chronometry Congress held September 16 – 19, 1968 in Paris, a report entitled "2,4-MHz Quartz Wristwatch", presented by J. Lüscher and H. Hofbauer, discussed a divider stage for a quartz timepiece with two amplifiers each constituted by a field-effect transistor of the insulated-gate type (IGFET) and a capacitor in series therewith. In that system, the principal amplifier controls the generation of the outgoing pulses of reduced cadence in response to periodic charging and discharging of an input capacitance defined by its insulated gate and its channel, the other amplifier forming part of the discharge circuit for that capacitance. Each amplifier is driven by a voltage taken from the junction of a pair of series transistors connected across a d-c power supply, one transistor of the pair receiving the incoming pulse sequence whose frequency is to be stepped down while the other transistor receives one of two trains of control pulses which are in mutual phase opposition. In such a divider the amplitude of the outgoing pulses could not exceed the voltage of the d-c supply.

With several such divider stages in cascade, the limited output amplitude of the preceding stage may result in an insufficiently rapid discharge of the gate capacitance of the principal IGFET of the following stage, especially at high pulse cadences on the order of several MHz.

OBJECT OF THE INVENTION

The object of our present invention, therefore, is to provide an improved frequency-divider stage of the character referred to whose outgoing pulses, at half the cadence of the incoming pulse sequence, have amplitudes not necessarily limited to the magnitude of an available d-c supply voltage.

SUMMARY OF THE INVENTION

In a binary frequency-divider stage according to our invention, two bus bars and two control leads are provided together with an input lead and an output lead, the bus bars being connected across a supply of direct current while the two control leads are connected to receive trains of oppositely phased and therefore effectively interleaved first and second control pulses. The divider stage also includes a plurality of IGFETs, of one and the same conductivity type, each with the usual pair of channel electrodes (source and drain) against which the insulated gate is capacitively chargeable. One of those IGFETs, forming part of an output amplifier as discussed above, is connected to one of the bus bars (referred to hereinafter, for convenience, as ground) while its series capacitor is connected to the first control lead, the junction between this IGFET and the capacitor being tied to the output lead on which an outgoing pulse is generated whenever the IGFET is cut off during the appearance of a first control pulse. The state of conduction of this IGFET is determined by a first charging circuit including a second and a third IGFET serially connected between its gate and the ungrounded bus bar, this circuit controlling the charging of the gate capacitance of the amplifying IGFET in two steps upon the successive conduction of its IGFETs whose control electrodes are respectively connected to the two control leads. The amplifying IGFET is cut off by the discharge of its gate capacitance via a normally blocked discharging circuit including a fourth and a fifth IGFET serially connected between its gate and ground, the fourth IGFET having its gate connected to the input lead for closure in the presence of a incoming pulse which coincides with a pulse on the second control lead. The fifth IGFET has a gate which, like the gate of the amplifying IGFET, is capacitively chargeable in two steps via a second charging circuit including a sixth and a seventh IGFET serially connected between the control electrode and the ungrounded bus bar, conduction of these latter IGFETs being respectively controlled by the incoming pulses on the input lead and by the pulses on the first control lead whereby the fifth IGFET is turned on by an incoming pulse and an immediately following first control pulse to condition the normally blocked discharge circuit of the amplifying IGFET for discharging the gate capacitance thereof upon the occurrence of the next incoming pulse. Thus, an outgoing pulse is generated upon the occurrence of a first control pulse immediately following the incoming pulse which causes the discharge of the gate capacitance of the amplifying IGFET. An eighth IGFET, connected between ground and the capacitively chargeable control electrode of the fifth IGFET, has its gate tied to the output lead in order to cut off the fifth IGFET upon the generation of an outgoing pulse.

BRIEF DESCRIPTION OF THE DRAWING

The above and other features of our invention will now be described in detail with reference to the accompanying drawing in which:

FIG. 1 is a circuit diagram of a first embodiment of our invention;

FIGS. 2a – 2g are a set of graphs relating to the operation of the system of FIG. 1;

FIG. 3 is a circuit diagram similar to FIG. 1, showing a second embodiment;

FIGS. 4a – 4h are a set of graphs relating to the operation of the system of FIG. 3;

FIG. 5 is a further circuit diagram illustrating a third embodiment; and

FIGS. 6a – 6g are a set of graphs relating to the operation of the system of FIG. 5.

SPECIFIC DESCRIPTION

The requency-divider stage shown in FIG. 1 comprises a capacitor $C_1$ and eight IGFETs $T_1 - T_8$ of conventional construction, i.e. with a semiconductive channel of one conductivity type (here $n^+$) integrated in a crystal substrate of opposite conductivity type, (here $p$), the channel extending between two main electrodes (source and drain) diffused into the substrate and being separated by an insulating layer from a gate or control electrode formed by a metallic deposit thereon. Inherent in such a structure is a certain capacitance between the gate and the channel, as well as between the two main electrodes in the nonconductive state of the IGFET, which allows each electrode to store a potential applied thereto; ancillary storage capacitors, however, may be provided between points of oppositely varying potentials as described hereinafter. Capacitor $C_1$ also is formed by a semiconductive $n^+$ zone in the $p$ substrate, with electrodes constituted by metallized areas on an insulating layer.

An analogous system may be provided, for all disclosed embodiments, with $p^+$ zones integrated in a substrate of $n$ type.

Two bus bars M and P are connected across a nonillustrated supply of direct current, e.g. a primary cell, bus bar M being at zero potential (ground) whereas bus bar P carries positive voltage. Two control leads 11 and 12 are energized, e.g. from a piezoelectrically tuned oscillator not shown, with relatively inverted pulse trains $\Phi_1$ and $\Phi_2$ in the form of continuous sine waves as illustrated for pulse train $\Phi_1$ in FIG. 2a. Incoming pulses $V_{E1}$, FIG. 2b, periodically appear on an input lead $E_1$ and are in phase with control pulses of train $\Phi_2$. These incoming pulses $V_{E1}$ could be derived, for example, from pulse train $\Phi_2$ in a preceding stage constructed in accordance with FIG. 5 described below.

Capacitor $C_1$ has one of its plates tied to control lead 11, its other plate forming a junction $d$ with one of the main electrodes (here considered the drain) of amplifying IGFET $T_1$ whose other main electrode (source) is grounded at bus bar M. IGFETs $T_2$ and $T_3$ are serially inserted between bus bar P and the gate lead of IGFET $T_1$, a point $c$ on that gate lead having a potential $V_c$ shown in FIG. 2e. IGFETS $T_2$ and $T_3$ form part of a first charging circuit, the potential $V_a$ of an intermediate point $a$ of that circuit being shown in FIG. 2c. A discharge path for the gate of IGFET $T_1$ extends from point $c$ via IGFET $T_3$, point $a$ and two further series IGFETs $T_4$, $T_5$ to bus bar M. IGFETs $T_2$, $T_3$, $T_4$ have their gates respectively connected to leads 11, 12 and $E_1$. A point $e$ on the gate lead of IGFET $T_5$, whose potential $V_e$ has been indicated in FIG. 2g, is linked with bus bar P via a second charging circuit including two series IGFETs $T_6$, $T_7$; an eighth IGFET $T_8$ lies between point $e$ and ground bus bar M. IGFETs $T_6$ and $T_7$ have gates respectively connected to leads $E_1$ and 11; the potential $V_b$ of an intermediate point $b$ is shown in FIG. 2d. The gate of IGFET $T_8$ is tied to the junction $d$ whose potential $V_d$ is plotted in FIG. 2f; junction $d$ lies on an output lead $E_2$ carrying output pulses $V_{E2} = V_d$.

At an instant $t_0$, at the beginning of an outgoing-pulse cycle, points $a$ and $c$ carry positive voltage $V_a$ and $V_c$ close to that of bus bar P whereas points $b$, $d$ and $e$ are at zero potential for reasons that will be apparent hereinafter. The occurrence of a positive-going pulse $\Phi_1$ in the interval $t_0 - t_1$ (coinciding with a negative-going pulse $\Phi_2$) unblocks the IGFETs $T_2$ and $T_7$ upon surpassing their threshold voltages but has no significant effect on either of these transistors (except for a slight rise of voltage $V_a$) inasmuch as no large potential difference exists across their channels. Pulse $\Phi_1$ also traverses the capacitor $C_1$ but does not materially change the output voltage $V_d$ since IGFET $T_1$ conducts owing to the positive voltage $V_c$ on its gate.

At instant $t_1$ an incoming pulse $V_{E1}$ appears on lead $E_1$ concurrently with a control pulse $\Phi_2$ on lead 12. With IGFET $T_5$ cut off by zero voltage $V_e$ on its gate, pulse $V_{E1}$ has no effect upon the potential $V_a$. By unblocking the IGFET $T_6$, however, it charges the point $b$ to a positive voltage $V_b$ which is stored thereon as long as IGFET $T_7$ remains cut off; the storage capacitance of point $b$ may be enhanced by the provision of an ancillary condenser $C_2$ connected between that point and the drain of IGFET $T_4$.

With the disappearance of pulses $V_{E1}$ and $\Phi_2$ at instant $t_2$ and the generation of another positive-going pulse $\Phi_1$ on lead 11, IGFET $T_7$ conducts to transfer part of the charge of point $b$ to point $e$ whereby voltage $V_b$ diminishes slightly and voltage $V_e$ goes positive. The next two pulses $\Phi_2$ and $\Phi_1$ have no significant effect.

At time $t_3$ another incoming pulse $V_{E1}$ appears on lead $E_1$ and, besides restoring voltage $V_b$ to its previous positive value, unblocks the discharge path for the gate of IGFET $T_1$ by turning IGFET $T_4$ on, IGFET $T_5$ being conductive at this time on account of its positive gate voltage $V_e$ whereas IGFET $T_3$ is also turned on by a control pulse $\Phi_2$ simultaneously present on lead 12. Thus, voltages $V_a$ and $V_c$ drop to zero by the time $t_4$ when this second incoming pulse $V_{E1}$ reaches its peak. The negative-going pulse $\Phi_1$ now appearing on lead 11 may tend to drive the point $d$ negative with reference to bus bar M; this results in reverse conduction of IGFET $T_1$, with interchange of its source and drain electrodes, whereby output lead $E_2$ remains close to ground potential.

At instant $t_5$, after the decay of pulse $V_{E1}$, IGFETs $T_4$ and $T_6$ are again nonconducting. The appearance of a pulse $\Phi_1$ on lead 11 gives rise to an outgoing pulse $V_{E2}$ at junction $d$ since IGFET $T_1$ is cut off at this time. As soon as this outgoing pulse surpasses the response threshold of IGFET $T_8$, voltage $V_e$ drops to zero so that IGFET $T_5$ again becomes nonconductive. Pulse $\Phi_1$ also unblocks the IGFET $T_2$ to raise the potential $V_a$ to its full value substantially equaling the voltage of bus bar P.

In the final phase of this cycle, between instants $t_6$ and $t_7$, a pulse $\Phi_2$ unblocks the IGFET $T_7$ to let part of the charge of point $a$ pass to point $c$ whereby IGFET $T_1$ becomes once more conductive and prevents the generation of another outgoing pulse $V_{E2}$ upon the occurrence of the next control pulse $\Phi_1$. Instant $t_7$ corresponds to time $t_0$ and represents the beginning of a new, identical cycle.

It will be noted that a phase shift occurs between incoming pulses $V_{E1}$ and outgoing pulses $V_{E2}$ inasmuch as the former coincide with the pulses $\Phi_2$ and the latter coincide with the pulses $\Phi_1$. This shift will have to be taken into account, of course, when several divider stages are connected in cascade.

Because the amplitude of outgoing pulse $V_{E2}$ depends only on the voltage of control lead $\Phi_1$, that amplitude may well exceed the d-c supply potential.

It will also be observed that voltages $V_a$, $V_b$, $V_c$ and $V_e$ have a period equal to that of voltage $V_d$ ($V_{E2}$) so as to constitute signals recurring at half the cadence of incoming pulses $V_{E1}$. This periodicity is particularly important from the viewpoint of low energy consumption inasmuch as the power dissipation of the system in its storage capacitances is proportional to the charging and discharging frequency.

An ancillary condenser $C_2$ may be inserted between point $b$ and the common terminal of IGFETs $T_4$ and $T_5$ as schematically indicated.

The system of FIG. 3, in which like reference characters have been used for analogous elements, differs from that of FIG. 1 in that the charging circuit including IGFETs $T_2$, $T_3$ for the gate of IGFET $T_1$ has been separated from its discharge path including IGFETs $T_4$, $T_5$, with IGFET $T_3$ no longer included in the latter path. In this case the conduction of IGFET $T_2$ charges a transfer point $f$ whose potential $V_f$ has been shown in FIG. 4h; point $a$ lies here on the drain lead of IGFET $T_4$ and its voltage $V_a$ drops to zero on every incoming pulse $V_{E1}$. In order to prevent a premature lowering of gate voltage $V_c$ after IGFET $T_5$ has been turned on at time $t_2$, the common terminal $a$ of IGFETs $T_4$ and $T_5$ is recharged to substantially the potential of bus bar P through an ancillary IGFET $T_9$, connected between that bus bar and point $a$, whose gate is tied to lead 11 so that this transistor conducts in the presence of a pulse $\Phi_1$. The charging of the gate capacitance of IGFET $T_1$ at time $t_6$, with IGFET $T_3$ conductive, results in a temporary reduction of voltage $V_f$ between instants $t_6$ and $t_7$, that voltage going to zero between times $t_3$ and $t_5$ when IGFETs $T_3$, $T_4$ and $T_5$ are simultaneously turned on. The operation is otherwise identical with that described above for the system of FIG. 1.

The ancillary condenser $C$, may here be inserted between points $a$ and $b$ as schematically indicated.

The system of FIG. 5 differs from that of FIG. 1 in that input lead $E_1$ now constitutes a branch of control lead 12, incoming pulses $V_{E1}$ thus coinciding with pulses $\Phi_2$. IGFET $T_3$ is again common to the charging and discharging paths of the gate capacitance of IGFET $T_1$. IGFETs $T_6$, $T_7$ and $T_8$ together form a common junction $g$ whose potential $V_g$ is shown in FIG. 6g and is used, upon conduction of IGFET $T_7$, to charge the gate capacitance of IGFET $T_5$ with a positive voltage $V_e$.

In this embodiment, only point $d$ is at ground potential at time $t_0$. Between instants $t_1$ and $t_2$, the simultaneous presence of a pulse $V_{E1}$ $\Phi_2$ on the gate of IGFETs $T_3$, $T_4$ and $T_6$ renders these transistors conductive whereby voltages $V_a$, $V_b$ and $V_c$ go to zero and IGFET $T_1$ is cut off; voltage $V_g$, which is somewhat below its maximum on account of a previous charge transfer to point $e$, is raised to substantially the potential of bus bar P. At time $t_3$ the positive-going pulse $\Phi_1$ on lead 11 generates an outgoing pulse $V_{E2}$ on lead $E_2$ tied to junction $d$; this pulse unblocks the IGFET $T_8$ so that voltage $V_9$ drops to zero while voltage $V_a$ goes positive with IGFET $T_2$ conducting and IGFET $T_3$ cut off. At instant $t_4$, IGFET $T_3$, $T_4$ and $T_6$ conduct again but, with IGFET $T_5$ cut off by the discharge of its gate capacitance ($V_e = 0$), voltage $V_a$ diminishes only slightly to recharge the gate capacitance of IGFET $T_1$ which therefore becomes nonconductive while voltage $V_f$ goes positive. The next pulse $\Phi_1$, starting at time $t_5$, is ineffectual as far as the output lead $E_2$ is concerned but unblocks the IGFETs $T_2$ and $T_7$ whereby voltage $V_a$ returns to its maximum value and the gate capacitance of IGFET $T_5$ is recharged from point $g$ whose potential $V_g$ is thus slightly lowered. At time $t_6$ the system has returned to its starting condition discussed with reference to instant $t_0$.

Two ancillary condensers $C_2$ and $C_3$ may be inserted between points $b$, $g$ and between points $a$, $g$, respectively, as schematically indicated.

If several divider stages of the type shown in FIG. 3 are connected in cascade, a storage capacitor may be inserted between the point $f$ of a preceding stage and the point $a$ of a succeeding stage. The last stage of the chain will then be supplemented by two further transistors, corresponding to IGFETs $T_4$ and $T_9$, to form a junction to which such a storage capacitor may be connected. These storage capacitors may be of the so-called "binary" type as disclosed, for example, in *Electronics* magazine, Vol. 46, No. 4, pages 115 – 117, in an article entitled "Two-Level Capacitor Boosts MOS Memory Performance" by L. Talamonti.

If two stages of the types respectively shown in FIGS. 5 and 3 follow each other, the circuitry may be simplified by letting the IGFETs $T_6$ and $T_8$ of the preceding stage (FIG. 5) takes over the functions of the IGFETs $T_9$ and $T_4$ of the succeeding stage (FIG. 3).

The electronic components of our improved frequency divider may be produced by integration of semiconductor zones in a substrate whose potential relative to the ground bus bar M reverse-biases the diodes formed by these zones so as to prevent any current flow therethrough. This measures diminishes the parasitic capacitance between the diffused zones and the substrate, with consequent reduction of energy consumption.

Finally, it should be pointed out that the sinusoidal and symmetrically bipolar waveforms shown in FIGS. 2a, 4a and 6a are not critical and that different types of signals, such as pulses, can be used instead. In fact, the foregoing discussion deals only with the positive half-cycles of these sine waves which can therefore be regarded as pulse trains.

We claim:
1. A binary frequency-divider stage comprising:
  a plurality of field-effect transistors of one and the same conductivity type each having a pair of channel electrodes and a capacitively chargeable insulated gate, said field-effect transistors including a first, a second, a third, a fourth, a fifth, a sixth, a seventh and an eighth transistor;
  a first and a second bus bar connected across a supply of direct current;
  a first control lead connected to receive a train of first control pulses;
  a second control lead connected to receive a train of second control pulses of the frequency of said first control pulses and oppositely phased with reference thereto;
  an amplifier including said first transistor and a capacitor in series therewith, said capacitor being connected to said first control lead and forming a junction with one channel electrode of said first transistor, the other channel electrode of said first transistor being connected to said first bus bar;
  an input lead for a sequence of incoming pulses of a cadence to be halved, said incoming pulses substantially coinciding with respective second control pulses;
  an output lead tied to said junction;
  a first charging circuit including said second and third transistors serially connected between said second bus bar and the gate of said first transistor for controlling the charging of the gate capacitance thereof, said second and third transistors having their gates respectively connected to said first and second control leads for conduction in the presence of said first and second control pulses;
  a normally blocked discharge circuit including said fourth and fifth transistors serially connected between said first bus bar and the gate of said first transistor, said fourth transistor having its gate connected to said input lead for conduction in the presence of an incoming pulse; and
  a second charging circuit including said sixth and seventh transistors serially connected between said second bus bar and the gate of said fifth transistor, said sixth and seventh transistors having their gates respectively connected to said input lead and to said first control lead whereby said fifth transistor is rendered conductive by an incoming pulse and an immediately following first control pulse to condition said normally blocked discharge circuit for discharging the gate capacitance of said first transistor upon the occurrence of the next incoming pulse with resulting generation of an outgoing pulse on said output lead upon the occurrence of the next-following first control pulse applied to said capacitor;

said eighth transistor being connected between said first bus bar and the gate of said fifth transistor for cutting off said fifth transistor by discharging the gate capacitance thereof upon the generation of said outgoing pulse, the gate of said eighth transistor being connected to said output lead.

2. A frequency-divider stage as defined in claim 1 wherein said third transistor is included in said discharge circuit in series with said fourth and fifth transistors.

3. A frequency-divider stage as defined in claim 1 wherein said input lead is a branch of said second control lead.

4. A frequency-divider stage as defined in claim 1 wherein said field-effect transistors include a ninth transistor inserted between said second bus bar and a common terminal of said fourth and fifth transistors for recharging said common terminal in response to a first control pulse immediately following an incoming pulse which discharges said common terminal, the gate of said ninth transistor being connected to said first control lead.

* * * * *